United States Patent [19]

Kumar

[11] Patent Number: 5,244,538
[45] Date of Patent: Sep. 14, 1993

[54] METHOD OF PATTERNING METAL ON A SUBSTRATE USING DIRECT-WRITE DEPOSITION OF A MASK

[75] Inventor: Nalin Kumar, Austin, Tex.

[73] Assignee: Microelectronics and Computer Technology Corporation, Austin, Tex.

[21] Appl. No.: 736,357

[22] Filed: Jul. 26, 1991

[51] Int. Cl.$^5$ .............................................. H05K 3/00
[52] U.S. Cl. ..................................... 156/643; 156/644; 156/645; 156/656; 156/659.1; 156/668; 427/123; 427/125
[58] Field of Search .................... 156/644, 643, 659.1, 156/668, 656, 645; 427/53.1, 56.1, 54.1, 250, 256, 123, 125; 437/203, 189, 228

[56] References Cited

U.S. PATENT DOCUMENTS

| | | | |
|---|---|---|---|
| 4,428,796 | 1/1984 | Milgram | 156/668 X |
| 4,566,937 | 1/1986 | Pitts | 156/659.1 X |
| 4,612,085 | 9/1986 | Jelks et al. | 156/659.1 X |
| 4,666,737 | 5/1987 | Gimpelson et al. | 156/644 X |
| 4,800,176 | 1/1989 | Kakumu et al. | 437/203 X |
| 4,816,361 | 3/1989 | Glendinning | 430/5 |
| 4,818,725 | 4/1989 | Lichtel, Jr. et al. | 437/203 |
| 4,822,633 | 4/1989 | Inoue | 427/43.1 |
| 4,830,706 | 5/1989 | Horwath et al. | 156/659.1 X |
| 4,876,112 | 10/1989 | Kaito et al. | 427/38 |
| 4,895,735 | 1/1990 | Cook | 437/43.1 |
| 4,961,822 | 10/1990 | Liao et al. | 437/203 X |
| 4,981,715 | 1/1991 | Hirsch et al. | 427/53.1 |
| 4,983,250 | 1/1991 | Pan | 156/628 |
| 5,100,501 | 3/1992 | Blumenthal et al. | 437/203 X |
| 5,118,385 | 6/1992 | Kumar et al. | 156/644 |
| 5,147,823 | 9/1992 | Ishibashi et al. | 437/228 X |

Primary Examiner—Thi Dang
Attorney, Agent, or Firm—David M. Sigmond

[57] ABSTRACT

A method of patterning metal on a substrate without photolithography. The steps include providing a dielectric substrate, forming a metal mask in a predetermined pattern on the substrate without using a mask by direct-write deposition using a particle beam such as a liquid metal cluster force to form the mask, dry etching the substrate to form a plurality of channels therein, depositing a conductive metal into the channels, and removing the mask. The top of the substrate can then be planarized by polishing, or alternatively the dielectric between the metal lines can be etched. The invention is well suited for fabricating copper/polyimide substrates.

35 Claims, 4 Drawing Sheets

METHOD OF PATTERNING METAL ON A SUBSTRATE USING DIRECT-WRITE DEPOSITION OF A MASK

BACKGROUND OF THE INVENTION

1. Field of the invention

The invention relates to a method of patterning metal on a dielectric substrate during fabrication of an electronic component, and more particularly to masklessly depositing a thin etch mask on a dielectric by direct-write prior to selectively etching channels in the dielectric and depositing conductive metal in the channels.

2. Description of Related Art

To form circuits, semiconductors and other electronic components need to be interconnected with each other. As semiconductors continue to improve in performance, cost, reliability and miniaturization, there is an intensive need in the electronics industry, especially for large scale computers, to package and interconnect these semiconductors without limiting system performance. One approach is mounting the components on high density multichip modules (electrical interconnect substrates). These modules normally contain buried electrical lines or channels which terminate at bonding pads on a mounting surface. By bonding electrical terminals on mounted components to bonding pads on the modules, multiple components can be electrically interconnected.

Applicant's recent cost modeling on fabrication of high density copper/polyimide modules reveals that, regardless of the fabrication process, the three costliest materials are the polyimide, substrate base, and photoresist chemicals. Polyimide cost can be reduced by replacing spin coating with less wasteful approaches, such as extrusion coating. Polyimide expenses can also be reduced by choosing polymers other than traditional polyimide. Photolithography tends to be the most expensive step. During conventional photolithography, resist material is deposited on a smooth upper surface of a layer, the resist layer is photoexposed through suitable artwork to define a pattern of areas where undeveloped resist (which may be exposed or unexposed) is washed away. An etch step is performed on the underlying layer, and the resist is stripped by wet chemicals. As such, photolithography not only requires expensive chemicals and aligners/steppers, but also is typically the most time consuming and labor intensive step. Furthermore, traditional photolithography optical aligners require very flat substrates due to the small depth of focus. This becomes an increasingly major drawback as larger substrates are used. Needless to say, any patterning technique without conventional photolithography is potentially valuable.

Other methods have formerly been developed in order to overcome the drawbacks of photolithography. The main thrust has been to develop several maskless (or re-usable mask) techniques to direct-write metal lines and features on substrates. Such techniques include liquid metal ion sources, liquid metal cluster sources, laser direct-write, chemical vapor deposition, ink jet printing, offset printing, palladium activated plating, and electron-beam enhanced deposition. These techniques have matured into relatively reliable processes. However, at present, none of these techniques have been widely accepted for manufacturing. Drawbacks arising from these techniques include low throughput, poor adhesion, high resistivity, high contact resistance, and poor resolution. Furthermore, the low deposition rates inherent in direct-write limit its usage to specific applications such as repair and fabrication of very thin lines (0.1 to 1 microns thick). But current multi chip modules typically require thick metal lines (on the order of 5 to 10 microns) and thus current state-of-the-art direct-write techniques can not form such lines in a practical manner.

The use of direct-write to form a mask for patterning metal lines has been described in U.S. Pat. No. 4,612,085 by Jelks et al. (hereinafter the '085). More particularly, the '085 describes a method of forming a molybdenum oxide plasma etch mask by selective pyrolytic photochemical decomposition on either a metal or dielectric surface. The process of the '085 is well suited for fabricating 0.5 to 1 micron thick features but unsuitable for fabricating 5 to 10 micron features for several reasons. First, the dry etch rate for most conductive metals of interest is so small as to nearly equal the dry etch rate for the mask. For instance, suppose 10 micron thick lines of copper (normally the conductive metal of choice) are desired. A mask approximately 10 microns thick becomes necessary to prevent erosion before the copper is patterned. But, as previously mentioned, direct-write of a 10 micron pattern (mask or metal line) is prohibitively time consuming. Furthermore, a wet etch is unsuitable for patterning metal lines with dimensions on the order of a few microns since isotropic undercutting would deform if not destroy the lines. Second, direct-write of a mask by the pyrolytic photochemical decomposition, as described in the '085, causes the mask features to grow laterally on each side as the thickness of the mask increases. This limits the aspect ratio of the mask openings (height/width) to 0.5. Third, pyrolytic photochemical decomposition suffers from inaccurate deposition placement due to scattered light. And fourth, deposition on the viewport through which the substrate is illuminated causes the process to be unreliable.

Therefore the related art does not teach how to pattern metal lines on a substrate without photolithography in a cost effective manner.

SUMMARY OF THE INVENTION

The present invention overcomes the aforementioned drawbacks by using direct-write deposition (without a mask or photolithography) of a thin mask in a pre-determined pattern over a dielectric substrate. A dry etch then forms channels in the dielectric, the channels are filled with conductive metal to form metal lines therein. Another etch can then remove the mask and, if desired, the dielectric between the lines can also be etched so that the lines protrude above the substrate.

An object of the present invention is to pattern relatively thick metal lines by direct-write without undue time delays. Direct-write is preferably by a liquid metal cluster source (LMCS).

Another object of the present invention is to provide a generic low cost patterning technique which may be used in several process approaches for fabricating copper/polymer substrates and other types of electronic components.

A feature in accordance with one aspect of the present invention provides a method of patterning metal on a substrate, comprising the steps of providing a dielectric substrate, forming a mask in a predetermined pattern on the substrate without using a mask by direct-write deposition using a particle beam, with the pattern containing a plurality of openings which selectively expose portions of the substrate, dry etching the exposed portions to form a plurality of channels in the substrate, depositing a conductive metal into the channels, and removing the mask. The top of the substrate can then be planarized by polishing, or alternatively the dielectric between the metal lines can be etched and removed.

An advantage of the present invention is the use of a thin (300 to 2,000 angstrom) sacrificial mask that need not satisfy demanding requirements for quality, resistance, adhesion, or contact resistance which are frequently imposed on direct-write materials. Thin masks are possible due to the large difference in etch rates to standard plasma gases between the mask and the dielectric. The etch rates between gold and polyimide, for example, differ by a factor of approximately 10-20 and thus only a very thin layer of gold is needed for patterning 10 micron thick channels for copper lines in polyimide.

Another advantage of the present invention is the ability to pattern 5 to 10 micron thick conductive lines in a substrate without photolithography or a mask, yet faster and less expensively than conventional direct-write of conductors.

Still a further advantage of the present invention is the ability to pattern thick conductive lines with high aspect ratios, such as between 5 and 10.

These and other objects, features and advantages of the present invention will be more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
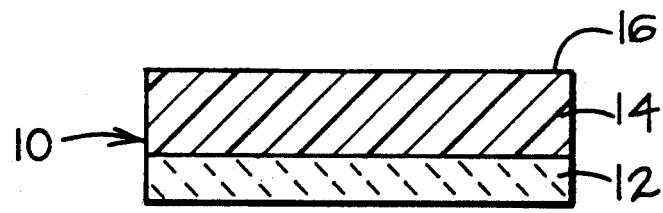
FIG. 1 shows a cross-sectional view of a dielectric substrate.

Referring now to the drawings wherein depicted elements are not necessarily shown to scale and wherein like or similar elements are designated by the same reference numeral through the several cross-sectional views and, more particularly to FIG. 1, an electronic component is exemplified as a copper/polyimide electrical interconnect or substrate 10, such as described in European Patent Application number 88308996.3 entitled "Customizable Circuitry." For illustration purposes, a dielectric substrate is shown as comprising a ceramic base 12 supporting an organic polymer such as 10 microns thick polyimide 14 with a smooth, substantially planar top surface 16.

Figure 2:
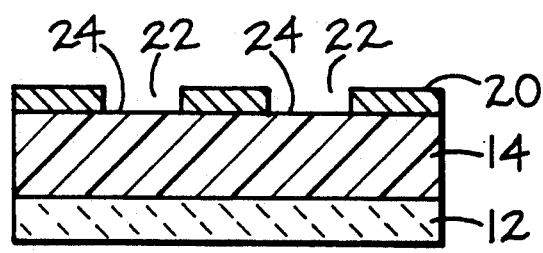
FIG. 2 shows a cross-sectional view of a mask deposited by direct-write on the substrate.

Referring now to FIG. 2, a thin etch mask is formed, in a predetermined pattern with a plurality of openings, on the dielectric substrate without using a mask by direct-write deposition using a particle beam. Direct-write by a liquid metal cluster source is preferred and illustrated herein. The mask is preferably a metal which is highly resistive to a dry etch, more preferably selected from the group of gold, copper, silver, aluminum, tungsten and alloys thereof, and most preferably gold. Furthermore, a relatively thin mask between approximately 300 to 2,000 angstroms thick is preferred. Thinner layers may be unreliable; thicker layers may require lengthy deposition times. The optimum mask thickness if approximately 300 angstroms. Returning to the example, a 300 angstrom thick gold mask 20 is formed or deposited on top surface 16 by direct-write from a liquid metal cluster source. Mask 20 is configured in a predetermined pattern containing a plurality of through-holes or openings 22 which selectively expose portions 24 of polyimide 14.

Figure 3:
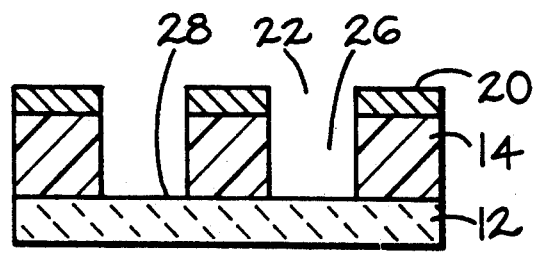
FIG. 3 shows a cross-sectional view of channels formed in the exposed dielectric by dry etching.

With reference now to FIG. 3, exposed portions of the dielectric are dry etched to form channels therein. Suitable dry etches include plasma etching, laser etching, reactive ion etching and ion milling. Reactive ion etching, for instance with an $O_2$ $CF_4$ gas mixture, is generally faster than ion milling or laser etching. Most preferred is an anisotropic plasma etch. In the present example, exposed portions 24 are plasma etched through openings 22. At this time, gold mask 20 etches approximately 10 to 20 times slower than polyimide 14. This assures mask 20 protects polyimide 14 outside openings 22 throughout the etching. Also, ceramic base 12 is highly resistive to the dry etch. As a result, 10 micron deep vertical channels 26 extend completely through polyimide 14 directly beneath openings 22, and the top of base 12 beneath openings 22 becomes channel bottoms 28. The sidewalls of channels 26 may taper inwardly slightly with increasing depth (not shown), for instance by 2°-5°. Alternatively, channels 26 can be formed to partially extend through polyimide 14. For instance (not shown), a reactive ion etch could form channels 5 microns deep, and a laser beam could impinge upon the channel bottoms to drill smaller vias through the remaining 5 microns of polyimide.

The next step of the present invention to deposit an electrically conductive metal into the channels to form patterned metal on the substrate. Many combinations of metals, etchants, predetermined patterns, deposition techniques and process sequences are suitable and well known in the art. Generally, copper and aluminum are the preferred metals, with electrolessly plated copper most preferred. While not mandatory, after metal is deposited in the channels additional processing steps can be taken. For example, if the metal is to remain "buried" in the dielectric then the mask can be removed and the top of the substrate planarized by polishing. On the other hand, if the metal is to protrude above the substrate then the mask can be removed by a first wet chemical etch and the unetched dielectric between the metal can be removed by a second wet chemical etch. Several such combinations are illustrated in FIGS. 4A-4D, 5A-5D, 6A-6C, and 7A-7D. Obviously, there is no attempt to provide an exhaustive list of combinations.

Figure 4A:
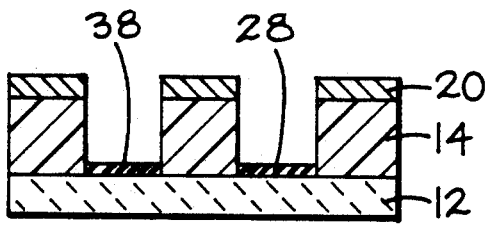
FIGS. 4A-4D show cross-sectional views of a first embodiment for forming patterned metal which includes depositing a conductive metal in the channels, stripping the mask, and planarizing the top of the substrate.
Figure 4B:
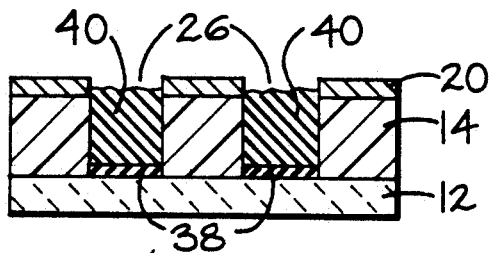
Figure 4C:
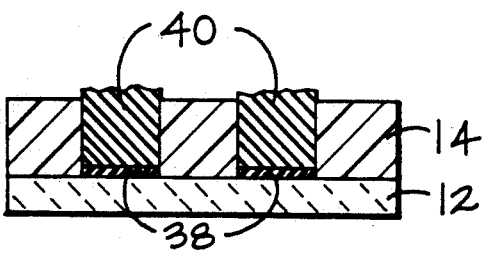

Referring now to FIGS. 4A-4D, a first embodiment for depositing metal into the channels in shown. In FIG. 4A an electroless activator (autocatalyst or seed) is deposited into the channels. As may been seen, a thin layer of tungsten 38 is deposited on channel bottoms 28 by chemical vapor deposition. In FIG. 4B copper 40 is electrolessly plated in channels 26. Detection of electroless via fill can be provided as described in U.S. Ser. No. 07/717,767 filed Jun. 19, 1991. In FIG. 4C mask 20 is removed by applying a wet chemical etch, and in FIG. 4D the top surface 41 is planarized by polishing.

Figure 5A:
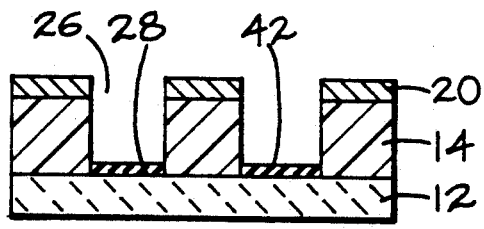
FIGS. 5A-5D show cross-sectional views of a second embodiment for forming patterned metal which includes depositing an initiator and a conductive metal in the channels, stripping the mask, and etching the dielectric between the metal lines.
Figure 5B:
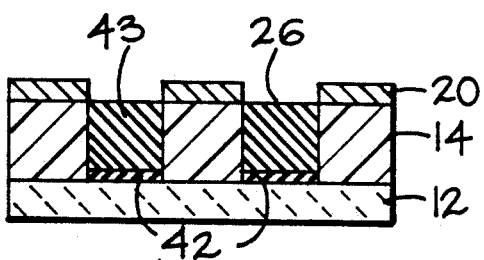
Figure 5C:
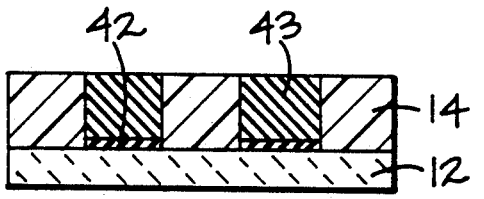
Figure 4D:
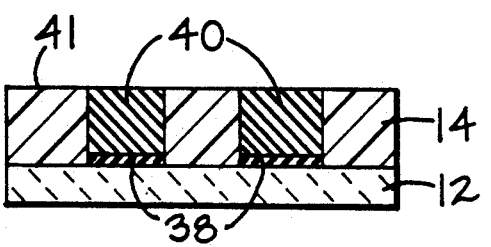
Figure 5D:
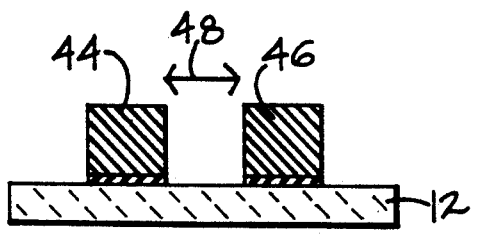

Referring now to FIGS. 5A-5D, a second embodiment for depositing metal into the channels in shown. In FIG. 5A an electroless activator is deposited into the channels by laser decomposition of palladium 42. In FIG. 5B copper 43 is electrolessly plated in channels 26. In FIG. 5C mask 20 is removed by applying a wet chemical etch, and in FIG. 5D the polyimide between the copper lines is removed by a second wet chemical etch. Copper lines 44 and 46 are seen as 10 microns thick and separated by a 2 micron space 48 from the nearest lines, resulting in an aspect ratio of 5 for lines 44 and 46.

Figure 6A:
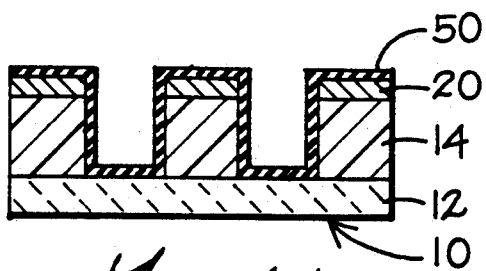
FIGS. 6A-6C show cross-sectional views of a third embodiment for forming patterned metal which includes depositing a conductive metal on the substrate, stripping the conductive metal, initiator and mask above the substrate, and planarizing the top of the substrate.
Figure 7A:
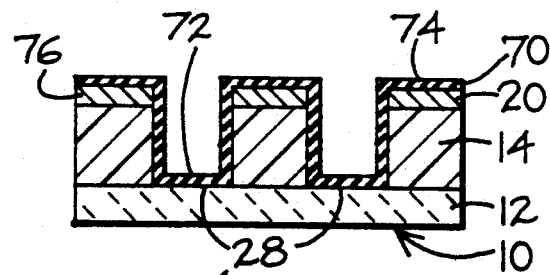
FIGS. 7A-7D show cross-sectional views of a fourth embodiment for forming patterned metal which includes depositing an adhesion on the substrate, etching the adhesion metal outside the channels and lifting off the mask, depositing a conductive metal in the channels, and etching the dielectric between the metal lines.
Figure 6B:
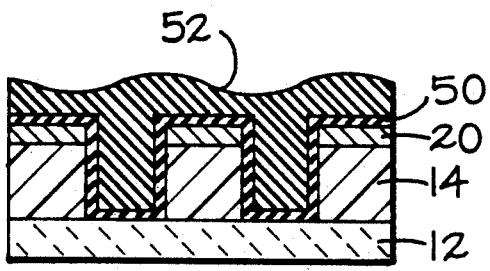
Figure 6C:
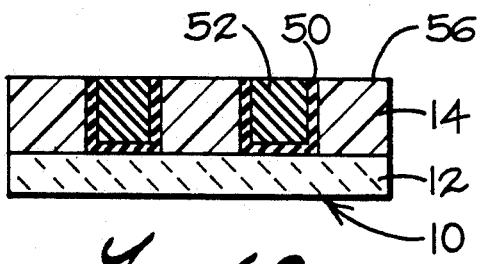
Figure 7C:
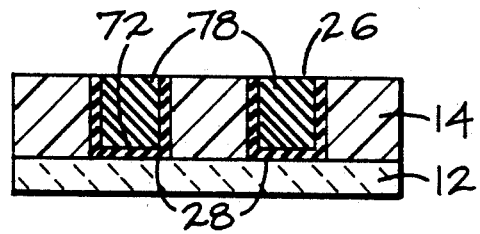
Figure 7D:
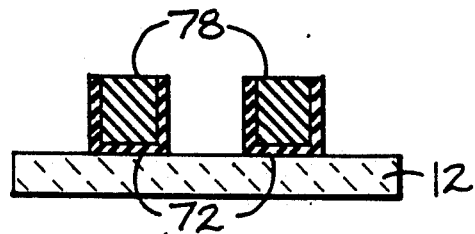

With reference now to FIGS. 6A-6C, a third embodiment for depositing metal into the channels in shown. In FIG. 6A, a blanket 700 angstrom chromium adhesion layer 50 is deposited over all of substrate 10. In FIG. 6B, copper 52 is deposited by one of sputtering, evaporating, or chemical vapor deposition on all of chromium 50. Thereafter, in FIG. 6C, mechanical polishing is applied to the top of substrate 10 to remove all of mask 20, chromium 50 and copper 52 above dielectric top surface 16, leaving copper 52 in and aligned with a smooth planar top surface 56.

Figure 7B:
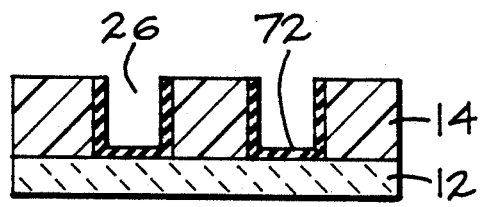

With reference now to FIGS. 7A-7D, a fourth embodiment for depositing metal into the channels in shown. Beginning in FIG. 7A, a 1,000 angstrom blanket layer of chromium 70 is deposited over substrate 10. Chromium portions 72 are seen to cover channel bottoms 28 and chromium portions 74 cover mask 20. In FIG. 7B, a wet etch is applied which initially attacks sides 76 (shown in FIG. 7A) of mask 20 and subsequently dissolves all of mask 20, thereby "lifting off" chromium portions 74 from the substrate. Such lift off processes are well known in the art. Thereafter, in FIG. 7C copper 78 is electrolessly deposited on chromium portions or seeds 72 to fill channels 26. Finally, in FIG. 7D a wet etch is applied to remove the polyimide between the copper lines so that the lines protrude above the substrate.

Figure 8:
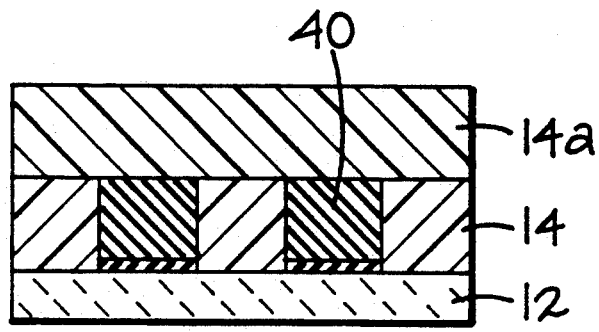
FIG. 8 shows a cross-sectional view of a second dielectric layer deposited on FIG. 4D.
Figure 9:
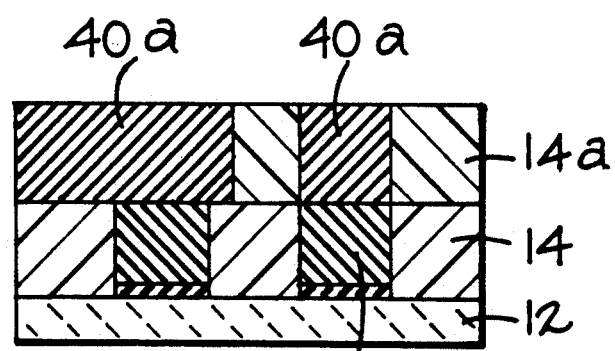
FIG. 9 shows a cross-sectional view of a multilayer structure fabricated by repeating the previous steps.

As should be clear to those skilled in the art, the forementioned steps can be repeated to construct a multilayer structure. Referring now to FIG. 8, wherein like parts are similarly numbered with the addition of the suffix "a", second polymer layer 14a is deposited on the structure in FIG. 4D. Thereafter, as seen in FIG. 9, the previously described steps are repeated to form a multilayer structure with a plurality of conductive metal channels 40a in second layer 14a.

In addition, stripping mask 20 takes advantage of polymer-to-polymer adhesion between layers 14 and 14a.

Finally, it is important to note that the present invention may be performed in a vacuum environment.

The present invention, therefore, is well adapted to carry out the objects and attain the ends and advantages mentioned, as well as others inherent therein. While presently preferred embodiments of the present invention have been described for the purpose of disclosure, numerous other changes and modifications in the details of construction, arrangement of parts and steps of processing can be carried out without departing from the spirit of the invention which is intended to be limited only by the scope of the appended claims.

What is claimed is:

1. A method of patterning metal on a substrate, comprising the steps of:
   providing a dielectric substrate with a substantially planar top surface;
   forming a metal etch mask in a predetermined pattern on said surface of the substrate without using a mask by direct-write deposition using a particle beam of metal particles to form said etch mask, said pattern containing a plurality of openings which selectively expose portions of said substrate;
   dry etching said exposed portions to form a plurality of channels in said substrate; and
   depositing a conductive metal into said channels;
   wherein said patterned metal comprises said conductive metal without said etch mask.

2. The method of claim 1 wherein said dielectric is a polymer.

3. The method of claim 1 wherein said polymer is polyimide.

4. The method of claim 1 wherein said direct-write deposition is performed by a liquid metal cluster source.

5. The method of claim 1 wherein said mask is removed from said substrate after the dry etching step.

6. The method of claim 1 wherein said mask is selected from the group consisting of gold, copper, aluminum, silver, tungsten and alloys thereof.

7. The method of claim 1 wherein said mask is gold and said direct-write deposition is performed by a liquid metal cluster source.

8. The method of claim 1 wherein said mask is approximately 300 to 2,000 angstroms thick.

9. The method of claim 1 wherein the etch rate of said mask is at least 10 times slower than the etch rate of said dielectric during the dry etching.

10. The method of claim 1 wherein said dry etching is performed by one of plasma etching, laser etching, reactive ion etching or ion milling.

11. The method of claim 1 wherein said dry etching is performed by anisotropic plasma etching.

12. The method of claim 1 wherein said conductive metal is selected from the group consisting of copper and aluminum.

13. The method of claim 1 wherein said conductive metal is copper.

14. The method of claim 13 wherein said copper is approximately 5 to 10 microns thick.

15. The method of claim 14 wherein said copper has an aspect ratio of at least 5.

16. The method of claim 1 wherein said mask is removed by wet chemical etching after the dry etching step.

17. The method of claim 16, further comprising planarizing said substrate by polishing after removing said mask so that said conductive metal is in and aligned with said surface.

18. The method of claim 16, further comprising performing each of said steps in a vacuum environment.

19. The method of claim 16, further comprising the step of etching the dielectric between lines of said conductive metal after removing said mask so that the lines of said conductive metal protrude above the substrate.

20. The method of claim 1 wherein said etch mask consists of said particles.

21. A method of patterning copper lines in a polymer layer of a multilayer electrical interconnect, comprising:
(a) direct-writing a metal etch mask in a predetermined pattern over a smooth top surface of a polymer layer on a substrate without using a mask, wherein said direct-writing is performed using a beam consisting of charged metal particles which form the entire etch mask, and said pattern contains a plurality of openings which selectively expose portions of said polymer;
(b) applying an anisotropic dry etch to said exposed polymer portions through said openings to form a plurality of channels in said polymer which correspond to said openings; and
(c) depositing copper into said channels, thereby forming a plurality of copper lines in a pattern corresponding to said openings of said predetermined mask pattern.

22. The method of claim 21, further comprising
depositing an activator material into said channels between steps (b) and (c), and
depositing said copper by electroless deposition.

23. The method of claim 22 wherein said activator material is tungsten.

24. The method of claim 21, further comprising
depositing an adhesion metal into said channels between steps (b) and (c).

25. The method of claim 24 wherein said adhesion metal is selected from the group consisting of chromium, titanium and tantalum.

26. The method of claim 21, further comprising
depositing a blanket layer of metal into said channels and over said mask between steps (b) and (c),
applying a wet chemical etch to lift the mask off the substrate between steps (b) and (c), and then
depositing said copper by electroless deposition.

27. The method of claim 21, further comprising
(d) stripping said etch mask, and then
(e) planarizing the top of the substrate by applying polishing, thereby forming a smooth top surface comprising the copper lines aligned with the polymer.

28. The method of claim 21, further comprising
(d) stripping said etch mask by applying a wet chemical etch, and
(e) applying a second wet chemical etch to remove the polymer between said copper lines, thereby forming copper lines which protrude above the top of said substrate.

29. The method of claim 28, wherein said copper lines protrude at least 5 microns above the top of said substrate.

30. A method of patterning metal on a substrate, comprising the steps of:
providing a dielectric substrate;
forming an etch mask in a predetermined pattern on the substrate without using a mask by direct-write deposition using a liquid metal cluster source to form said etch mask, said pattern containing a plurality of openings which selectively expose portions of said substrate;
dry etching said exposed portions to form a plurality of channels in said substrate; and
depositing a conductive metal into said channels.

31. The method of claim 2 wherein said dielectric is a polymer and said conductive metal is copper.

32. A method of patterning metal on a substrate without photolithography, comprising the steps of:
depositing a metal etch mask on a dielectric substrate without using a mask by direct-write using a particle beam to form said etch mask;
dry etching the substrate to form a plurality of channels therein; and
depositing a conductive metal into the channels.

33. A method of patterning copper on a polymer substrate, comprising the steps of:
providing a polymer substrate with a substantially planar top surface;
depositing an etch mask in a predetermined pattern on said surface without using a mask by direct-write from a liquid metal cluster source, wherein said etch mask is formed from particles provided by the liquid metal cluster source beam and said pattern contains a plurality of openings which selectively expose portions of said surface;
anisotropically dry etching said exposed portions to form a plurality of channels in said substrate; and
depositing copper into said channels;
wherein said patterned copper comprises said deposited copper without said etch mask.

34. A method of patterning copper lines on a polymer substrate, comprising the following steps in the sequence set forth:
providing a polymer substrate with a substantially planar top surface;
depositing a metal etch mask approximately 300 to 2,000 angstroms thick in a predetermined pattern on said surface of the polymer without using a mask by direct-write from a liquid metal cluster source, wherein said etch mask is formed from particles provided by the liquid metal cluster source beam, and said pattern contains a plurality of openings which selectively expose portions of said polymer;
anistropically dry etching said exposed portions to form a plurality of channels at least 5 microns deep in said polymer;
depositing copper into said channels; and
wet chemical etching said mask, thereby forming copper lines at least 5 microns thick with a configuration corresponding to said openings in said predetermined pattern and in said polymer.

35. A method of patterning copper lines above a polymer substrate, comprising the following steps in the sequence set forth:
providing a polymer substrate with a substantially planar top surface;
depositing a metal etch mask approximately 300 to 2,000 angstroms thick in a predetermined pattern on said surface of the polymer without using a mask by direct-write from a liquid metal cluster source, wherein said etch mask is formed from particles provided by the liquid metal cluster source beam, and said pattern contains a plurality of openings which selectively expose portions of said polymer;

anisotropically dry etching said exposed portions to form a plurality of channels at least 5 microns deep in said polymer;

depositing copper into said channels;

applying a first wet chemical etch to remove said mask; and applying a second wet chemical etch to remove the polymer between the copper, thereby forming copper lines at least 5 microns thick with a configuration corresponding to said openings in said predetermined pattern and protruding above said polymer.

* * * * *